(12) United States Patent
Culpepper et al.

(10) Patent No.: US 7,557,470 B2
(45) Date of Patent: Jul. 7, 2009

(54) 6-AXIS ELECTROMAGNETICALLY-ACTUATED MESO-SCALE NANOPOSITIONER

(75) Inventors: Martin L. Culpepper, Marblehead, MA (US); Dariusz Golda, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 106 days.

(21) Appl. No.: 11/709,596

(22) Filed: Feb. 22, 2007

(65) Prior Publication Data

US 2007/0220882 A1    Sep. 27, 2007

Related U.S. Application Data

(63) Continuation-in-part of application No. 11/037,866, filed on Jan. 18, 2005.

(60) Provisional application No. 60/777,252, filed on Feb. 27, 2006.

(51) Int. Cl.
*H02K 41/00* (2006.01)
*H02K 33/00* (2006.01)

(52) U.S. Cl. .................... 310/15; 310/12; 74/490.08

(58) Field of Classification Search ............... 310/12, 310/15; 74/490.08
See application file for complete search history.

(56) References Cited

U.S. PATENT DOCUMENTS

| | | | |
|---|---|---|---|
| 5,160,877 A | 11/1992 | Fujiwara et al. | |
| 5,400,661 A | 3/1995 | Cook et al. | |
| 5,724,015 A | 3/1998 | Tai et al. | |
| 5,789,892 A | 8/1998 | Takei | |
| 5,834,864 A | 11/1998 | Hesterman et al. | |
| 5,863,024 A | 1/1999 | Blind et al. | |
| 5,945,898 A | 8/1999 | Judy et al. | |
| 6,084,281 A | 7/2000 | Fullin et al. | |
| 6,122,149 A | 9/2000 | Zhang et al. | |
| 6,369,400 B1 * | 4/2002 | Haeberle et al. | 250/548 |
| 6,414,823 B1 | 7/2002 | Crane et al. | |
| 6,484,602 B1 | 11/2002 | Dagalakis et al. | |
| 6,588,081 B2 | 7/2003 | Botos et al. | |
| 6,661,617 B1 | 12/2003 | Hipwell, Jr. et al. | |
| 6,694,603 B1 | 2/2004 | Zhang et al. | |
| 6,798,609 B1 | 9/2004 | Bonin et al. | |
| 6,809,436 B2 | 10/2004 | Chang et al. | |
| 6,847,133 B2 * | 1/2005 | Baccini | 310/12 |
| 6,891,600 B2 | 5/2005 | Frissen et al. | |
| 6,982,898 B2 | 1/2006 | Rust | |

(Continued)

OTHER PUBLICATIONS

Eleftheriou, E., et al., Millipede—a MEMS-based scanning-probe data-storage system. IEEE Transactions on Magnetics, 2003. 39(2): p. 938-45, Mar. 2003.

(Continued)

*Primary Examiner*—Karl I Tamai
(74) *Attorney, Agent, or Firm*—Sampson & Assoc., P.C.

(57) ABSTRACT

A MEMS actuator includes a coil stack in the form of microfabricated, electrically conductive first and second superposed layers. A magnet array is superposed in magnetic communication with the coil stack, with first and second coils being selectively, electrically actuatable to generate relative movement between the coil stack and the magnet array both in-plane and out-of-plane. In various embodiments, a plurality of the actuators are integrally coupled to a microfabricated compliant mechanism to provide a high bandwidth, six degree of freedom nanopositioner.

26 Claims, 11 Drawing Sheets

U.S. PATENT DOCUMENTS

| | | | | |
|---|---|---|---|---|
| 7,161,657 | B2* | 1/2007 | De Weerdt | 355/53 |
| 2002/0047318 | A1* | 4/2002 | Choi et al. | 310/12 |
| 2007/0220882 | A1* | 9/2007 | Culpepper et al. | 60/527 |

OTHER PUBLICATIONS

Chen, K.-S., D.L. Trumper, and S.T. Smith, Design and control for an electromagnetically driven X-Y-θ stage. Precision Engineering, 2002. 26(4): p. 355-369, Jan. 2002.

Culpepper, M.L. and G. Anderson, Design of a low-cost nano-manipulator which utilizes a monolithic, spatial compliant mechanism. Precision Engineering, 2004. 28(4): p. 469-482, Feb. 2004.

Compter, I.J.C., Electro-dynamic planar motor. Precision Engineering, 2004. 28: p. 171-180, Aug. 2003.

Kohlmeier, T., V. Seidemann, S. Buttgenbach, H. H. Gatzen, Application of UV depth lithography and 3D-microforming for high aspect ratio electromagnetic microactuator components, 2002 Microsystem Technologies 8, p. 304-307, Aug. 2002.

Lee, Dong-weon, Takahito Ono, and Masayoshi Esashi, High-Speed Imaging by Electro-Magnetically Actuated Probe with Dual Spring, 2000 IEEE, p. 419-424, Dec. 2000.

Lee, Won Chul, Young-Hyun Jin and Young-Ho Cho, Nonlinearly Modulated Digital Microactuators for Nano-Precision Digital Motion Generation, 2002 IEEE, p. 594-597.

Legtenberg, Rob, John Gilbert, Stephen D. Senturia, Electrostatic Curved Electrode Actuators, 1997 IEEE, p. 257-265, Sep. 1997.

Lehr, H., W. Ehrfeld, M. Schmidt, E. Kallenbach, and H.A. Tuan; Application of the LIGA technique for the development of microactuators based on electromagnetic principles, 1992 IOP Publishing Ltd., p. 229-233.

Li, Jian, Michael P. Brenner, Jeffrey H. Lang, Alexander H. Slocum, and Ralf Struempler, Drie-Fabricated Curved-Electrode Zipping Actuators with Low Pull-In Voltage, 2003 IEEE, p. 480-483, Jun. 2003.

Liu, Cheng-Tsung and Tsung-Shiun Chiang, Design and Performance Evaluation of a Microlinear Switched-Reluctance Motor, 2004 IEEE, p. 806-809, Mar. 2004.

Lutwyche, M., U. Drechsler, W. Haberle, H. Rothuizen, R. Widmer and P. Vettiger, Planar Micromanetic X/Y/Z Scanner with Five Degrees of Freedom, Electrochemical Society Proceedings, vol. 98-20, p. 423-433.

Malshe, Ajay P., K. Virwani, K.P. Rajurkar, and D. Deshpande; Investigation of Nanoscale Electro Machining (nono-EM) in Dielectric Oil, 2005, Annual CIRP 2005, (4 pages), Aug. 2005.

Mita, Makoto, Hiroaki Kawara, Hiroshi Toshiyoshi, Junji Endo, and Hiroyuki Fujita, Bulk Micromachined Tunneling Tips Integrated with Positioning Actuators, 2005, IEEE, p. 23-28, Feb. 2005.

Miyajima, Hiroshi, Nobuyoshi Asaoka, Michitsugu Arima, Yukiaki Minamotor, Kenzi Murakami, Kazunari Tokuda, and Kazuya Matsumoto, A Durable, Schock-Resistant Electromagnetic Optical Scanner with Polyimide-Based Hinges, 2001 IEEE, p. 418-424, Sep. 2001.

Miyajima, Hiroshi, Nobuyoshi Asaoka, Toshihiko Isokawa, Masanori Ogata, Yukihiro Aoki, Masaharu Imai, Osamu Fujimori, Masahiro Katashiro, and Kazuya Matsumoto, A MEMS Electromagnetic Optical Scanner for a Commercial Confocal Laser Scanning Microscope, 2003 IEEE, p. 243-251, Jun. 2003.

Niarchos, D., Magnetic MEMS: key issues and some applications, 2003 Elsevier B. V., p. 166-173.

Norwood, R.A., J. Holman, L. W. Shacklette, S. Emo, N. Tabatabaie, H. Guckel, Fast, low insertion-loss optical switch using lithographically defined electromagnetic microactuators and polymeric passive alignment structures, 1998, American Institute of Physics, p. 3187-3189, Nov. 1998.

Pantazi, A., M.A. Lantz, G. Cherubini, H. Pozidis and E. Eleftheriou, A servomechanism for a micro-electro-mechanical-system-based-scanning-probe data storage device; 2004, IOP Publishing Ltd., p. S612-A621, Aug. 2004.

Pozidis, H., W. Haberle, D. Wiesmann, U. Drechsler, M. Despont, T.R. Albrecht, and E. Eleftheriou; Demonstration of Thermomechanical Recording at 641 Gbit/in2, 2004, IEEE, p. 2531-2536, Jul. 2004

Quemper, Jean-Marie, Elisabeth Dufour-Gergam, Nadege Frantz-Rodriquez, Jean-Paul Gilles, Jean-Paul Grandchamp and Alain Bosseboeuf, Effects of direct and pulse current on copper electrodeposition through photoresist molds, 2000, IOP Publishing Ltd., p. 116-119.

Rehder, Jorg; Pirmin Rombach, Ole Hansen, Magnetic flux generator for balanced membrane loudspeaker, 2002, Elsevier Science B.V., p. 61-67.

Ren H., and E. Gerhard, Design and fabrication of a current-pulse-excited bistable magnetic microactuator, 1997, Elsevier Science S.A., p. 259-264.

Rogge, B., J. Schulz, J. Mohr, A. Thommes and W. Menz, Fully batch fabricated magnetic microactuators using a two layer LIGA process, 1995, Transducers '95—Eurosensors IX, p. 320-323, Jun. 1995.

Rothuizen, H., M. Despont, U. Drechsler, G. Genolet, W. Haberle, M. Lutwyche, R. Stutz, and P. Vettiger, Compact Copper/Epoxy-Based Electromagnetic Scanner for Scanning Probe Applications, 2002, IEEE, p. 582-585.

Rothuizen, H., U.Drechsler, G. Genolet, W. Haberle, M. Lutwyche, R. Stutz, R. Widmer, P. Vettiger, Fabrication of a Micromachined Magnetic X/Y/Z Scanner for Parallel Scanning Probe Applications, 2000, Elsevier Science B.V., p. 509-512.

Sadler, Daniel J., Trifon M. Liakopoulos, and Chong H. Ahn, A Universal Electromagnetic Microactuator Using Magnetic Interconnection Concerpts, 2000 IEEE, p. 460-468, Dec. 2000.

Seidemann, Volker, Jens Edler, Stephanus Buttgenbach and Hans-Dieter Stolting, Linear Variable Reluctance (VR) Micro Motor with Horizontal Flux Guidance; Concept, Simulation, Fabrication and Test; 2003 IEEE, p. 1415-1418, Jun. 2003.

Shutov M.V., E.E. Sandoz, D.L. Howard, T.C. Hsia, R. L. Smith, S.D. Collins, A microfabricated electromagnetic linear syschronous motor, 2005 Elsevier B.V., p. 566-575, May 2005.

Smith, Gabe, John Maloney, Lawrence Fan, and Don L. DeVoe, Large Displacement Microactuators In Deep Reactive Ion Etched Single Crystal Silicon, 2001, SPIE, p. 138-147.

Stoev, K., F. Liu, X. Shi, H.C. Tong, Y. Chen, C. Chien, Z. W. Dong, M. Gibbons, S. Funada, P. Prabhu, H. Nguyen, D. Wachenschwanz, L. Mei, M. Schultz, S. Malhotra, B. Lal, J. Kimmal, M. Russak, A. Talalai, and A. Varlahanov, Demonstration and Chracterization of Greater than 60/Gb/in2 Recording Systems, 2001, IEEE, p. 1264-1267, Jul. 2001.

Sverdlov, Yelena, Yuri Rosenberg, Yu.I. Rozenberg, Ron Zmood, Raviv Erlich, Sivan Natan, Yosi Shacham-Diamand, The electrodeposition of cobalt-nichel-iron high aspect ratio thick film structures for magnetic MEMS applications, 2004, Elsevier B.V., p. 258-265, Aug. 2004.

Tabat, N., J. Klein and H. Guckel, Single Flux-Path Bidirectional Linear Actuators, 1997, IEEE, p. 789-792, Jun. 1997.

Tang, Weilong, Viktoria Temesvary, Raanan Miller, Amish Desai, Yu-Chong Tai and Denny K. Miu, Silicon Micromachined Electromagnetic Microactuators for Rigid Disk Drives, 1995, IEEE, p. 2964-2966, Nov. 1995.

Taylor, William P., Oliver Brand, and Mark G. Allen, Fully Integrated Magnetically Actuated Micromachined Relays, 1998, IEEE, p. 181-191, Jun. 1998.

Tilmans, H. A. C., E. Fullin, H. Ziad, M. D. J. Van de Peer, J. Kesters, E. Van Geffen, J. Bergqvist, M. Pantus, E. Beyne, K. Baert and F. Naso, A fully-Packaged Electromagnetic Microrelay, 1999, IEEE, p. 25-30.

Trumper, David L., Won-jong Kim, and Mark E. Williams, Design and Analysis Framework for Linear Permanent-Magnet Machines, 1996, IEEE, p. 371-379, Mar. 1996.

Tsaur, Jiunnjye, Lulu Zhang, Ryutaro Maeda, S. Matsumoto, 2D Micro Scanner Actuated by Sol-gel Derived Double Layered PZT, 2002, IEEE, p. 548-551.

Verma, Shobhit, Won-jong Kim, and Jie Gu, Six-Axis Nanopositioning Device With Precision Magnetic Levitation Technology, 2004, IEEE, p. 384-391, Jun. 2004.

Wagner, B., and W. Benecke, Microfabricated Actuator with Moving Permanent Magnet, 1991, IEEE, p. 27-32.

Wong, Jo-Ey, Jeffrey H. Lang, and Martin A. Schmidt, An Elecrostatically-Actuated MEMS Switch for Power Applications, 2000, IEEE, p. 633-638.

Wright, John A., Yu-Chong Tai and Shih-Chia Chang, A Large-Force, Fully-Integrated MEMS Magnetic Actuator, 1997, IEEE, p. 793-796, Jun. 1997.

Wright, John A., and Yu-Chong Tai, Magnetostatic MEMS Relays for the Miniaturization of Brushless DC Motor Controllers; 1999, IEEE, p. 594-599.

Yeh, Richard, Seth Hollar, and Kristofer S. J. Pister, Single Mask, Large Force, and Large Displacement Electrostatic Linear Inchworm Motors, 2002, IEEE, p. 330-336, Aug. 2002.

Zhou, Yong, Chun-Sheng Yang, Ji-An Chen, Gui-Fu Ding, Wen Ding, Li Wang, Ming-Jun Wang, Ya-Ming Zhang, Tai-Hua Zhang, Measurement of Young's modulus and residual stress of copper film electroplated on silicon wafer, 2004, Elsevier B. V., p. 175-180, Mar. 2004.

Taylor, William P., John D. Brazzle, Amy Bowman Osenar, Christopher J. Corcoran, Ijaz H. Jafri, Daniel Keating, Gregory Kirkos, Matthew Lockwood, Ajay Pareek and Jonathan J. Bernstein, A high fill factor linear mirror array for a wavelength selective switch, 2004 IOP Publishing Ltd, p. 147-152, Oct. 2003.

Hoen, S., et al. A high-performance dipole surface drive for large travel and force. in IEEE International Solid-State Sensors and Actuators Conference, Jun. 8-12, 2003. 2003. Boston, MA, USA: IEEE.

Choi, J.-j., et al., Electromagnetic Micro x-y Stage for Probe-Based Data Storage. Journal of Semiconductor Technology and Science, 2001. 1(1): p. 84-93, Mar. 2001.

Cugat, O., J. Delamare, and G. Reyne, Magnetic Micro-Actuators and Systems (MAGMAS.IEEE Transactions on Magnetics, 2003. 39(5): p. 3607-3612, Nov. 2003.

Kim, K.H., et al., Fabrication and test of a micro electromagnetic actuator. Sensor and Actuators A: Physical, 2005. 117: p. 8-16, Aug. 2004.

Ahn, S.-H. and Y.-K. Kim, Silicon scanning mirror of two DOF with compensation current routing. Journal of Micromechanics and Microengineering, 2004. 14: p. 1455-1461, Aug. 2004.

Bernstein, J.J., et al., Electromagnetically Actuated Mirror Arrays for Use in 3-D Optical Switching Applications. Journal of Microelectromechanical Systems, 2004. 13(3): p. 526-535, Jun. 2004.

Ko, J.S., et al., Development and application of a laterally driven electromagnetic microactuator. Applied Physics Letters, 2002. 81(3): p. 547-9, Jul. 2002.

Horsley, D.A., et al., Optical and mechanical performance of a novel magnetically actuated MEMS-based optical switch. Journal of Microelectromechanical Systems, 2005. 14(2): p. 274-284, Apr. 2005.

Han, J.S., J.S. Ko, and J.G. Korvink, Structural optimization of a large-displacement electromagnetic Lorentz force microactuator for optical switching applications. Journal of Micromechanics and Microengineering, 2004. 14(11): p. 1585-1596, Aug. 2004.

Han, J.S., et al., Parametric study and optimization of a micro-optical switch with a laterally driven electromagnetic microactuator. Journal of Micromechanics and Microengineering, 2002. 12(6): p. 939-47, Sep. 2002.

Cho, H.J. and C.H. Ahn, Magnetically-driven bi-directional optical microscanner. Journal of Micromechanics and Microengineering, 2003. 13(3): p. 383-389, Feb. 2003.

Hah, D., et al., Low-voltage, large-scan angle MEMS analog micromirror arrays with hidden vertical comb-drive actuators. Journal of Microelectromechanical Systems, 2004. 13(2): p. 279-89, Feb. 2003.

Asada, N., et al., Silicon micro-optical scanner. The 10th International Conference on Solid-State Sensors and Actuators Transducers '99, Jun. 7-Jun. 10, 1999, 2000. 83(1): p. 284-290.

Ahn, C.H. and M.G. Allen, A fully integrated surface micromachined magnetic microactuator with a multilevel meander magnetic core. Journal of Microelectromechanical Systems, 1993. 2(1): p. 15-22, Mar. 1993.

Fullin, E., et al. A new basic technology for magnetic micro-actuators. in Proceedings IEEE Eleventh Annual International Workshop on Micro Electro Mechanical Systems An Investigation of Micro Structures, Sensors, Actuators, Machines and Systems, Jan. 25-29, 1998. 1998 Heidelberg, Germany: IEEE.

Gray, J., Gary D. and P.A. Kohl, Magnetically bistable actuator: Part 1. Ultra-low switching energy and modeling. Sensors and Actuators A: Physical, 2005. 119(2): p. 489-501, Dec. 2004.

Gray Jr., G.D., et al., Magnetically bistable actuator: Part 2. Fabrication and performance. Sensors and Actuators, A: Physical, 2005. 119(2): p. 502-511, Dec. 2004.

Brunet, M., et al., Thick photoresist development for fabrication of high aspect ratio magnetic coils. Journal of Micromechanics and Microengineering, 2002. 12: p. 444-449, Jun. 2002.

Choi, Y., K. Kim, and M.G. Allen. Continuously-varying, three-dimensional SU-8 structures: Fabrication of inclined magnetic actuators. in 15th IEEE International Conference on Micro Electro Mechanical Systems MEMS 2002, Jan. 20-24, 2002. 2002. Las Vegas, NV: Institute of Electrical and Electronics Engineers Inc.

Grade, J.D., H. Jerman, and T.W. Kenny, Design of Large Deflection Electrostatic Actuators.Journal of Microelectromechanical Systems, 2003. 12(3): p. 335-343, Jun. 2003.

Deutsch, E.R., et al. A Large-Travel Vertical Planar Actuator with Improved Stability. in Transducers '03 -12th International Conference on Solid State Sensors, Actuators, Microsystems. 2003. Boston, MA, Jun. 2003.

Greywall, D.S., et al., Crystalline Silicon Tilting Mirrors for Optical Cross-Connect Switches. Journal of Microelectromechanical Systems, 2003. 12(5): p. 708-712, Oct. 2003.

Hah, D., et al., A self-aligned vertical comb-drive actuator on an SOI wafer for a 2D scanning micromirror. Journal of Micromechanics and Microengineering, 2004. 14(8): p. 1148-56, Jun. 2004.

Fischer, K. and H. Guckel, Long throw linear magnetic actuators stackable to one millimeter of structural height. Microsystem Technologies, 1998. 4(4): p. 180-3, 1998.

Cho, H.J. and C.H. Ahn, A bidirectional magnetic microactuator using electroplated permanent magnet arrays. Journal of Microelectromechanical Systems, 2002. 11(1): p. 78-84, Feb. 2002.

Fohse, M., T. Kohlmeier, and H.H. Gatzen, Thin film technologies to fabricate a linear microactuator. Proceedings of 3rd European Conference on Magnetic Sensors and Actuators. EMSA 2000, Jul. 19-21, 2000, 2001. A91(1-2): p. 145-9.

Cho, H.J. and C.H. Ahn, Microscale resin-bonded permanent magnets for magnetic micro-electro-mechanical systems applications. Journal of Applied Physics, 2003. 93(10): p. 8674-6, May 2005.

Damean, N., et al., Composite ferromagnetic photoresist for the fabrication of microelectromechnical systems. Journal of Micromechanics and Microengineering, 2005. 15(1): p. 29-34, Oct. 2005.

Feustel, A., O. Krusemark, and J. Muller, Numerical simulation and optimization of planar electromagnetic actuators. Sensors and Actuators A: Physical, 1998. 70: p. 276-282, Feb. 1998.

Ahn, H.-S., Y. Chen, and H. Dou, State-periodic adaptive compensation of cogging and coulomb friction in permanent-magnet linear motors. IEEE Transactions on Magnetics, 2005. 41(1): p. 90-98, Jan. 2005.

* cited by examiner

6-AXIS ELECTROMAGNETICALLY-ACTUATED MESO-SCALE NANOPOSITIONER

RELATED APPLICATION

This application claims the benefit of U.S. Provisional Application Ser. No. 60/777,252, entitled 6-Axis Electromagnetically-Actuated Meso-Scale Nanopositioner, filed on Feb. 27, 2006, the contents of which are incorporated herein by reference in their entirety for all purposes. This application is a Continuation-In-Part of U.S. patent application Ser. No. 11/037,866, filed on Jan. 18, 2005, entitled Multiple Degree of Freedom Micro Electro-Mechanical System Positioner and Actuator. This application is also related to U.S. Pat. No. 7,093,827, filed on Jun. 19, 2002, entitled Multiple Degree Of Freedom Compliant Mechanism, the contents of which are incorporated herein by reference in their entirety for all purposes.

GOVERNMENT SPONSORSHIP

This invention was made with government support awarded under NSF Grant No. DMI-0348242. The government has certain rights in this invention.

BACKGROUND

1. Technical Field

This invention relates to MEMS devices, and more particularly to a microfabricated nanopositioner capable of movement in six degrees of freedom.

2. Background Information

Throughout this application, various publications, patents and published patent applications are referred to by an identifying citation. The disclosures of the publications, patents and published patent applications referenced in this application are hereby incorporated by reference into the present disclosure.

A wide variety of micro-fabricated nanopositioners are known in the art. These devices are operated by a variety of actuation species, including electrostatic, electromagnetic, electrothermal, and piezoelectric.

These nanopositioners are motion systems capable of positioning a sample in space with nanometer precision (e.g., within tens of nanometers). Nanopositioners can operate in multiple axes, to provide accurate orientation in many degrees-of-freedom (DOF). Multi-axis meso-scale (e.g., 5 to tens of millimeter- or coin-sized) nanopositioners may enable high-speed and precise positioning and measurement in the biological sciences, data storage, probing equipment for nano-scale measurements, and nanomanufacturing processes. Emerging applications in these fields would benefit from portable, multi-axis, nanometer-level positioning over a range of tens-of-microns at speeds of hundreds to thousands of Hertz.

Relatively large, macro-scale nanopositioners can position large and small objects over a range of hundreds of microns with nanometer precision in up to six degrees-of-freedom, but their relatively large masses limit their natural frequencies to 10-100 Hz. Many of these devices operate under closed loop control, require high-voltage power supplies, and often cost thousands of dollars. In addition, thermal fluctuations can generate relatively large position errors in macro-scale machines. The positioning of small-scale samples, such as probe tips, cells, thin-film samples, and micro-optics, often does not require the force and stroke capabilities of these large nanopositioners.

The mismatch between the length/time scales (i.e., range of motion and speed of movement) of macro-scale positioners and many nano-scale phenomena limits the use of these nanopositioners in future small-scale applications. For instance, nano-scale electro-machining is a serial process requiring as little as several hundreds of microseconds to remove cubic-nanometers of material. Sample moves of several microns should be executed in milliseconds and with nanometer precision in order to make the nano-machining process practical and time efficient. As another example, probe-based data storage may also benefit from millisecond move times and nanometer precision in order to improve data rates and storage density.

However, such small scale nanopositioners have not been previously developed. Although much of the physics scale from macro- to micro-scale systems, microfabrication constraints fundamentally change the design methodology for small-scale nanopositioners. Assembly and fabrication methods used to realize macro-scale electromagnetic (EM) actuators are generally unsuitable for building micro- and meso-scale (i.e., microfabricated) actuators.

Contrary to the conventional approaches used to fabricate macro-scale actuators, microfabricated micro-coil structures are limited to generally planar geometries. For example, a planar EM actuator is disclosed in U.S. Pat. No. No. 6,369,400 (the '400 patent). This patent discloses a magnetic scanning or positioning system fabricated using conventional microlithographic techniques. The system includes a base equipped with magnets, a movable platform equipped with electrical coils, and suspension elements providing an elastic connection between the movable platform and the supporting base. The electrical coils are positioned flat on the movable platform, to form a substantially flat arrangement with the movable platform. The '400 patent teaches that combining the flat arrangement with the flat supporting base yields a scanning or positioning system which is potentially compact, lightweight and flat and which features fast response, low power consumption and a relatively wide range of motion, e.g., between 1 μm and 10 mm. The device is taught to be useful in the field of scanning probe microscopy or in the field of data storage or imaging.

A drawback, however, of this approach is that the coils are rigidly coupled to the movable stage, which results in a relatively large moving mass. This large mass and its associated low resonance frequency, results in a relatively low bandwidth, i.e., slow response time. This configuration also results in a relatively large footprint, which tends to undesirably limit component density. In addition, the system as shown is limited to motion in 5 DOF (not 6), and suffers from a relatively complex fabrication process.

Realizing six DOF, open-loop positioning, with precision to within tens of nanometers at speeds of hundreds to a thousand Hz or more will require a departure from the traditional micro-scale and macro-scale EM actuator design.

In light of the foregoing, a need exists for a meso-scale, multi-axis nanopositioning system capable of operating at hundreds of Hz to kilohertz frequencies with tens-of-microns of stroke, and nanometer level precision.

SUMMARY

In one aspect of the invention, an electromagnetically actuated microfabricated nanopositioner includes a compliant mechanism and a plurality of microfabricated actuators. The compliant mechanism includes a stage, a support, a plurality of flexures coupled to the stage and to the support, and a plurality of beams each coupled to one of the flexures. The beams are sized and shaped so that their displacement generates a displacement of the stage relative to the support. The actuators are coupled to the beams, each actuator including a coil stack of first and second coils in the form of electrically conductive superposed layers extending parallel to the compliant mechanism. A magnet array is disposed in magnetic communication with the coil stack. The coils are each selectively, electrically actuatable to generate relative movement between the coil stack and the magnet array both in-plane and out-of-plane, so that the stage is configured for controlled movement with 6 degrees of freedom.

In another aspect of the invention, a MEMS actuator includes a coil stack of first and second coils in the form of microfabricated, electrically conductive first and second superposed layers. A magnet array is superposed in magnetic communication with the coil stack. The first and second coils are selectively, electrically actuatable to generate relative movement between the coil stack and the magnet array both in-plane and out-of-plane.

In yet another aspect of the invention, a method is provided for effecting a MEMS actuation. The method includes providing at least one actuator having first and second coils in the form of microfabricated, electrically conductive first and second superposed layers, and a magnet array superposed, in magnetic communication, with the coils. The method further includes selectively, electrically actuating the first and second coils to generate relative movement between the coil stack and the magnet array both in-plane and out-of-plane.

BRIEF DESCRIPTION OF THE DRAWINGS

The above and other features and advantages of this invention will be more readily apparent from a reading of the following detailed description of various aspects of the invention taken in conjunction with the accompanying drawings.

DETAILED DESCRIPTION

In the following detailed description, reference is made to the accompanying drawings that form a part hereof, and in which is shown by way of illustration, specific embodiments in which the invention may be practiced. These embodiments are described in sufficient detail to enable those skilled in the art to practice the invention, and it is to be understood that other embodiments may be utilized. It is also to be understood that structural, procedural and system changes may be made without departing from the spirit and scope of the present invention. The following detailed description is, therefore, not to be taken in a limiting sense, and the scope of the present invention is defined by the appended claims and their equivalents. For clarity of exposition, like features shown in the accompanying drawings are indicated with like reference numerals and similar features as shown in alternate embodiments in the drawings are indicated with similar reference numerals.

Figure 1:
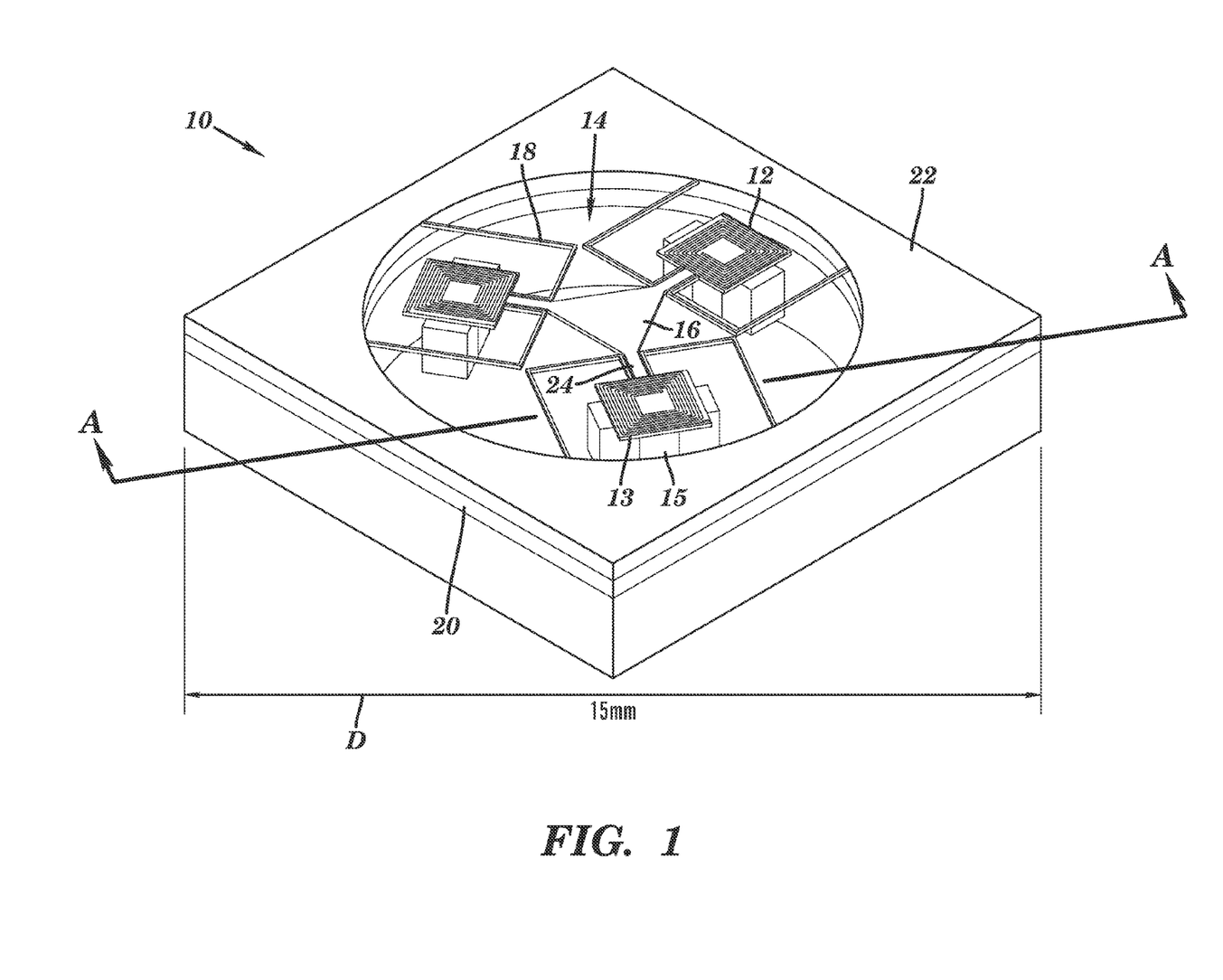
FIG. 1 is perspective view of an exemplary embodiment of a nanopositioner of the present invention.

As shown in FIG. 1, embodiments of the present invention include a micro-electromagnetically actuated, meso-scale, high speed, microlithographic nanopositioning system that operates with nanometer (e.g., within tens of nanometers) precision in multiple axes. These embodiments thus include a MEMS (Micro Electro-Mechanical System) nanopositioner 10 having a series of actuators 12 in the form of stacked microfabricated coils (coil stack) 13 and magnet arrays 15. These actuators are coupled to a microfabricated compliant mechanism 14 (including a stage 16 supported by a plurality of flexures 18) of the type disclosed in U.S. Pat. No. 7,093,827 entitled Multiple Degree Of Freedom Compliant Mechanism (the '827 patent), which is fully incorporated by reference herein.

The actuators 12, while being substantially planar, are capable of both in-plane and out-of-plane movement. When coupled to the compliant mechanism 14, the result is a nanopositioner 10 that is easily fabricated on a small scale (e.g., 15 mm to 30 mm or less) using conventional microfabrication (e.g., micro-lithographic) techniques, and which is capable of generating controlled movement with nanometer precision in a full 6 degrees of freedom.

These embodiments include a relatively low moving mass, by decoupling much of the movement of the coils from that of the central stage, as discussed in greater detail hereinbelow. This aspect, in combination with the optional moving-coil configuration also discussed below, tends to provide various embodiments with a relatively high resonance frequency, and concomitantly, high bandwidth (i.e., high speed) response times. Embodiments of the invention also provide convenient compensation for any thermal errors and/or actuator torque.

Figure 2:
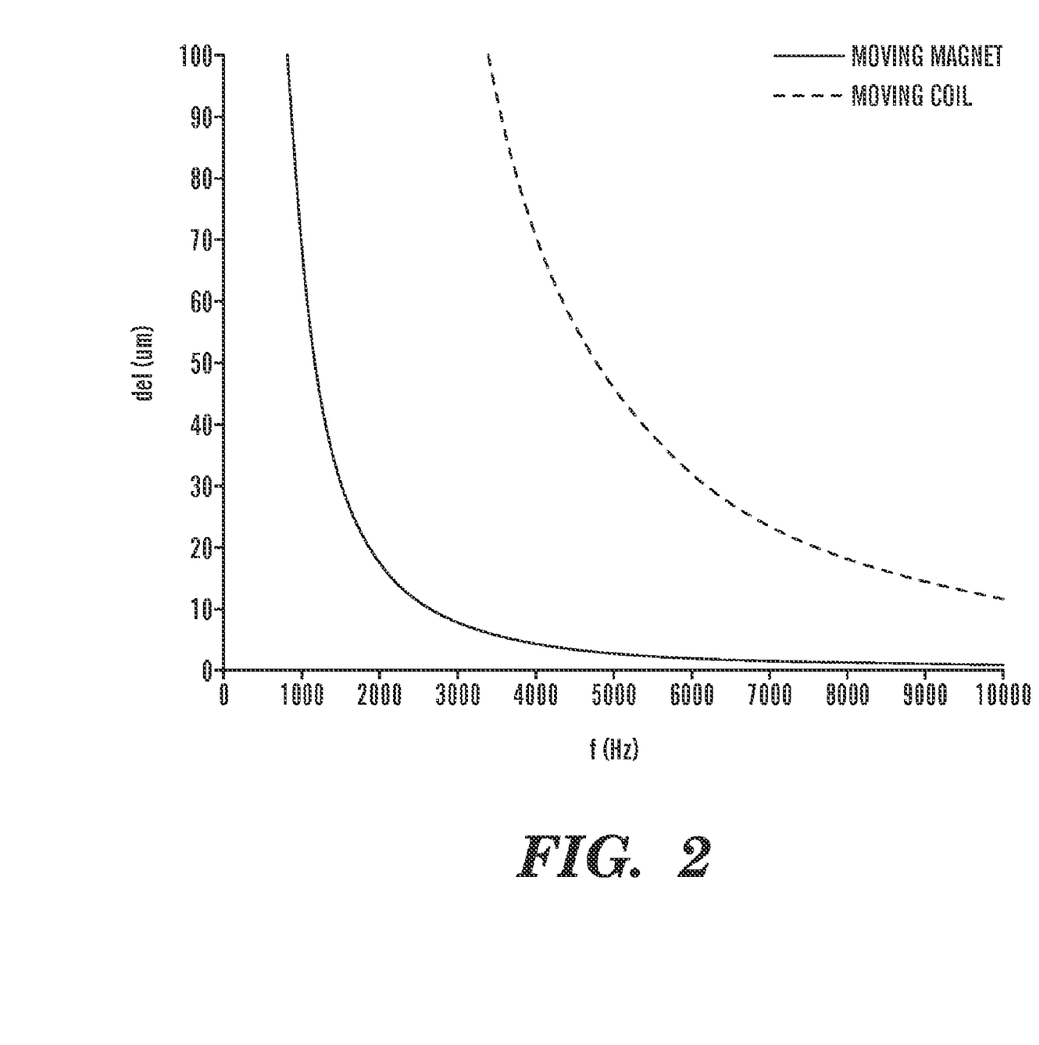
FIG. 2 is a graphical representation of the natural frequencies of moving coil versus moving magnet actuators of the present invention.

As mentioned, embodiments may be provided with either a moving-coil or a moving-magnet configuration. In both instances, control is achieved by energizing the coil structure. Moving-magnet actuators may benefit from minimal heat generation on the moving stage 16, since the coil structure (which generates heat) is mechanically (and thus substantially thermally) isolated from the stage. However, moving-magnet systems employ a larger sprung mass than similarly sized moving-coil systems, which provides the moving-magnet system with a lower natural frequency. This may be seen in FIG. 2, in which the extra sprung mass of an exemplary one DOF moving-magnet actuator has a natural frequency that is substantially lower than a similar moving-coil actuator.

Many embodiments of the present invention thus may benefit from using a moving-coil configuration. However, it has been found that coil heat dissipation may affect precision and repeatability. Thermal simulation of various configurations has indicated that the resulting out-of-plane position error from heating may be as high as about 1000 nm if not compensated. Embodiments of the present invention thus provide thermal error correction capabilities that may reduce these errors to less than 25 nm, as discussed in greater detail hereinbelow. When so corrected, the dynamic benefit of these moving-coil embodiments tends to outweigh the loss in precision for many applications. In addition, relatively difficult assembly of millimeter-sized magnets onto delicate microfabricated flexures may be advantageously avoided by use of moving-coil configurations.

Turning back to FIG. 1, a representative embodiment of multi-axis nano-positioner 10 of the present invention is described in greater detail. This embodiment includes multi-level planar micro-coil stacks 13 fabricated onto planar compliant mechanism 14. A support (ground) portion 22 of the coil/mechanism combination is then bonded to a spacer 20 which includes a meso-scale array 15 of permanent magnets that creates an external magnetic field. As mentioned above, mechanism 14 is a six-axis (i.e., six DOF) spatial compliant flexure such as disclosed in the '827 patent.

Compliant mechanism 14 is a microfabricated (e.g., microlithographic) device including stage 16, a support 22, and a series of flexures 18 coupled to the support and to the stage (e.g., via beams 24 and paddles 26). The beams 24 are sized and shaped so that displacement thereof generates a displacement of the stage relative to the support. This beam/flexure configuration also provides a mechanical advantage which effectively decouples much of the movement of coils 28, 30 from stage 16. Such decoupling, in combination with the fixed-magnet/moving-coil, provides these embodiments with a relatively small moving mass and large bandwidth.

Figure 3A:
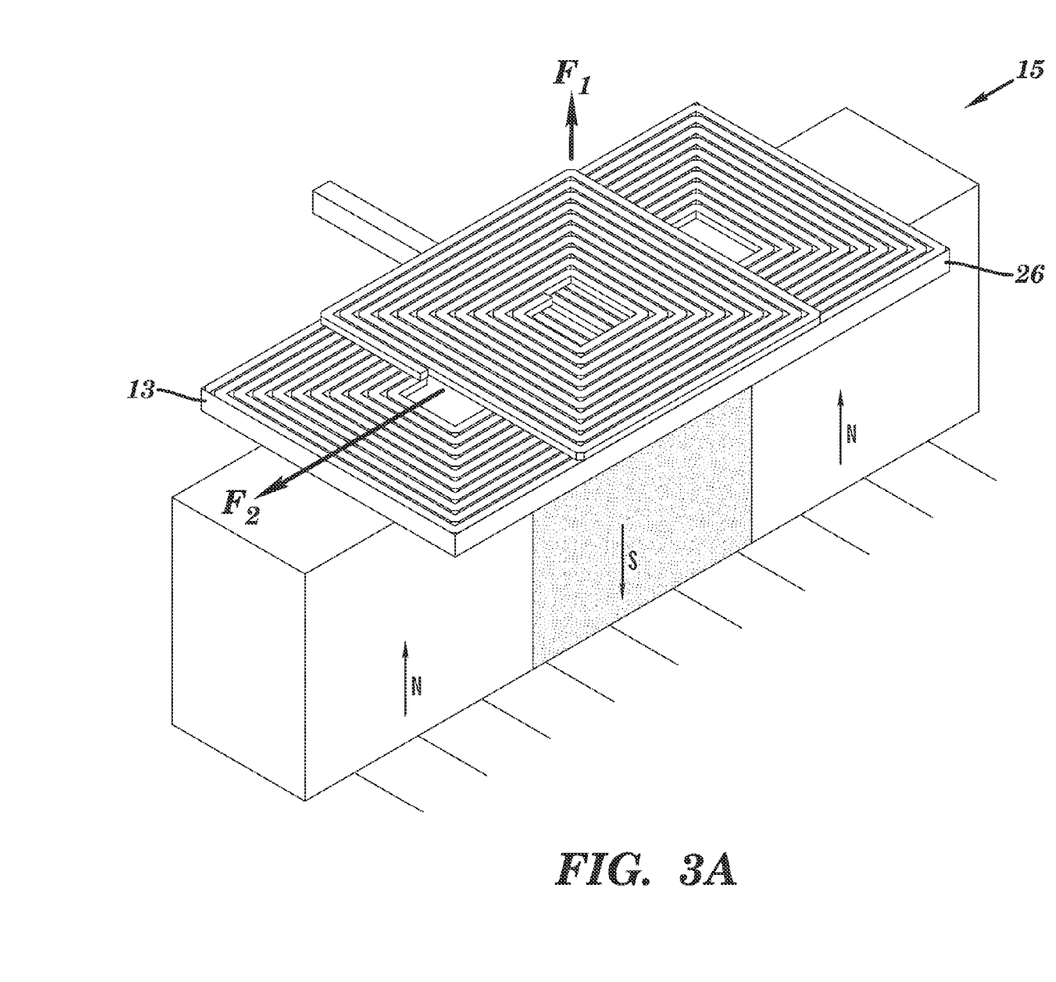
FIG. 3A is a perspective view of an exemplary moving coil actuator used in the embodiment of FIG. 1.
Figure 3B:
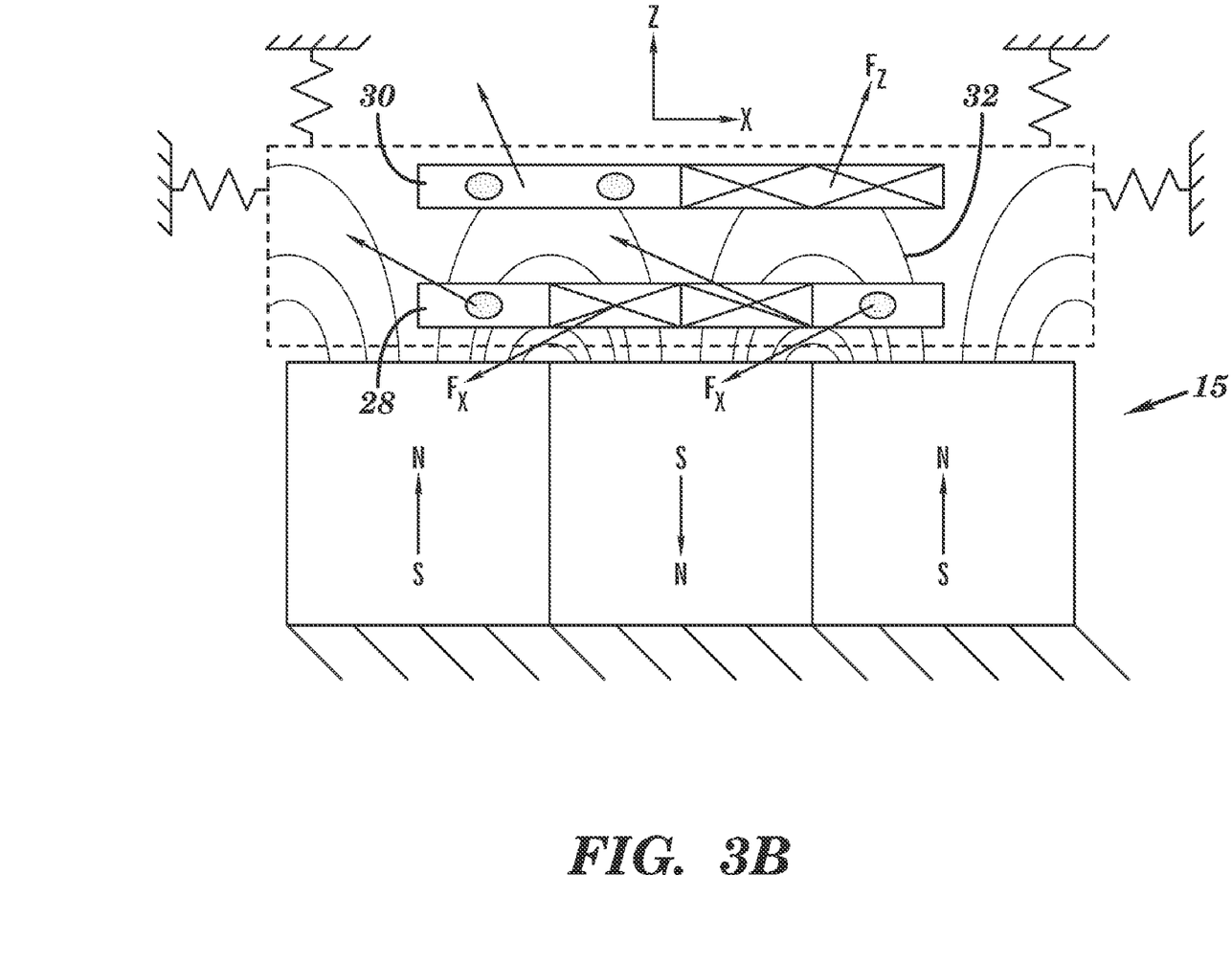
FIG. 3B is a cross-sectional schematic view of the actuator of FIG. 3A, taken along A-A of FIG. 1, showing stacked X- and Z-coils suspended above a fixed 3-pole permanent magnet array.

Turning now to FIGS. 3A-3B, each actuator 12 includes a first coil (e.g., x-actuator coil) 28 in the form of a microfabricated, electrically conductive first layer, and at least one second coil (e.g., z-actuator coil) 30 in the form of a microfabricated electrically conductive second layer superposed with first coil 28 to form coil stack 13. Magnet array 15 is disposed in magnetic communication with coil stack 13 as shown. The first and second coils 28, 30 are selectively, electrically actuatable to generate relative movement between the coil stack 13 and magnet array 15 both in-plane (e.g., in the X-Y plane as shown) and out-of-plane (e.g., in the X-Z plane as shown), so that stage 16 is configured for controlled movement with 6 degrees of freedom.

Figure 3C:
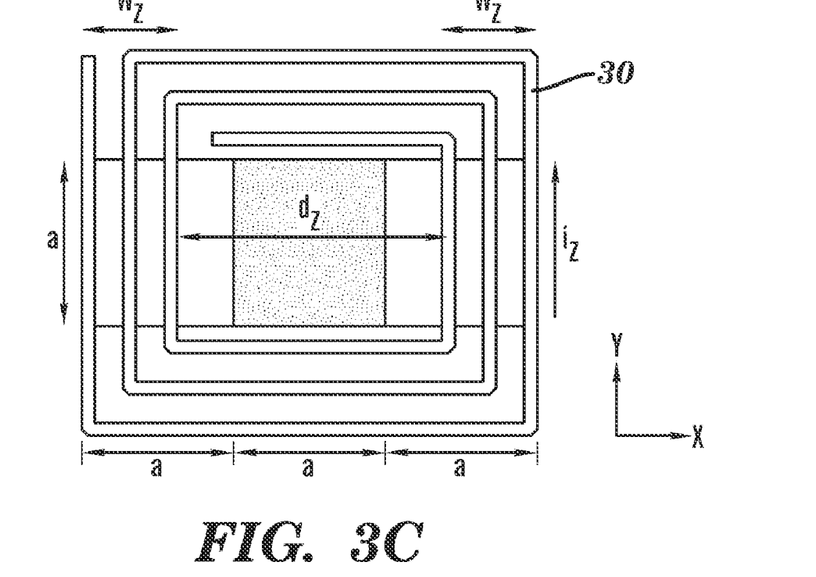
FIG. 3C is a schematic plan view of the Z-actuator coil of FIG. 3B.
Figure 3D:
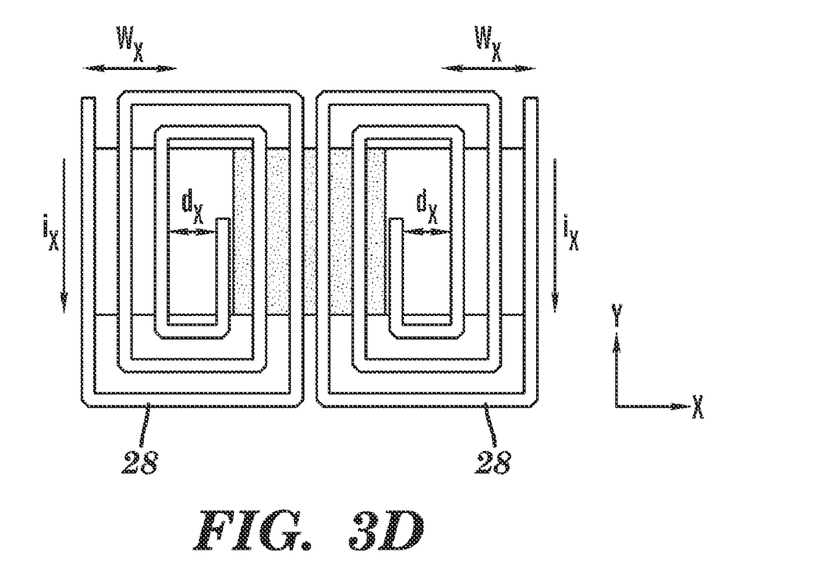
FIG. 3D is a schematic plan view of the X-actuator coils of FIG. 3B.

Referring now to FIGS. 3B-3D, operation of actuators 12 will now be described. As independent control currents Ix and Iz from a suitable power supply (not shown) flow through each coil 28, 30, a Lorentz force F acts on each coil, which is generally orthogonal to the magnetic flux lines 32 passing therethrough. This force F is described by the following Equation 1:

$$F = \int_s I ds \times B \qquad \text{Eq. 1}$$

in which I is the current flowing through the coil, S is the total length of the coil, and B is the magnetic flux density (e.g., in air) generated by the magnet array 15. Equation 1 holds for small coil sections, and low current densities relative to the equivalent current density of the permanent magnet. Embodiments of the present invention employ this phenomenon by choosing the phases and spacing of coils 28 and 30 relative to the magnet assembly so that the net resultant coil forces are predominantly in the X- and Z-directions, respectively.

For example, as shown in FIGS. 3B and 3C, upper coil 30 is centered on the center magnet of array 15, with magnetic flux lines 32 passing substantially along the X axis (e.g., horizontally in the orientation shown) through the coil. As such, current Iz (FIG. 3C) through coil 30 generates predominantly out-of-plane Z-forces (Fz, as shown).

Referring to FIGS. 3B and 3D, two coils 28 are disposed side-by-side, with the set being centered on the magnets of array 15. The coils 28 are close enough to magnet array 15 so that flux lines 32 are oriented predominantly on the Z axis as they pass therethrough. Current Ix through both of the coils thus generates predominantly in-plane, X-forces (Fx, FIG. 3B).

Although the aforementioned construction provides coil 28 with predominantly in-plane forces, it should be recognized that flux lines 32 will not be purely Z-directed. Rather, as they pass through coils 28, flux lines 32 will have some non-Z (e.g., X-directed) component, due to the slight curvature of the flux as it passes through the coil. This X-component will generate some Z-directed forces on coils 28, to generate a net force that is angled slightly out of plane (out of the X-Y plane as shown). This may create a parasitic moment tending to rotate the actuator about the Y-axis, which, in some applications, may lead to parasitic positioning errors.

In various embodiments of the present invention, such parasitic moments may be compensated by use of multiple actuators, such as in the three-actuator arrangement shown in FIG. 1. In addition, and/or alternatively, any parasitic moments may be substantially eliminated by careful selection of coil geometries relative to the dimension of magnet array 15. For example, as shown in FIGS. 3C and 3D, the geometric parameters d, a, and w associated with coil 28, as described in Table 1 below, may be adjusted for torque cancellation.

TABLE 1

| Actuator geometric parameters | |
|---|---|
| Parameter | Description |
| a | X and Y dimensions of the individual magnets of array 15 |
| d | ($d_z$, $d_x$) gap distance between adjacent coil segments carrying current in the positive and negative y-directions |
| w | ($w_z$, $w_x$) Overall width of y-directed coil segments carrying current in same direction |
| i | ($i_z$, $i_x$): electrical current in the coils |

Moment cancellation in coil 28 (x-actuator) may be achieved by (1) setting w, a, i, coil spacing (of any adjacent coils 28), and coil height (Z distance above magnet array 15, FIG. 3B) to obtain the desired force; and (2) computing the forces and moments generated by various values of ratio d/a.

Figure 4A:
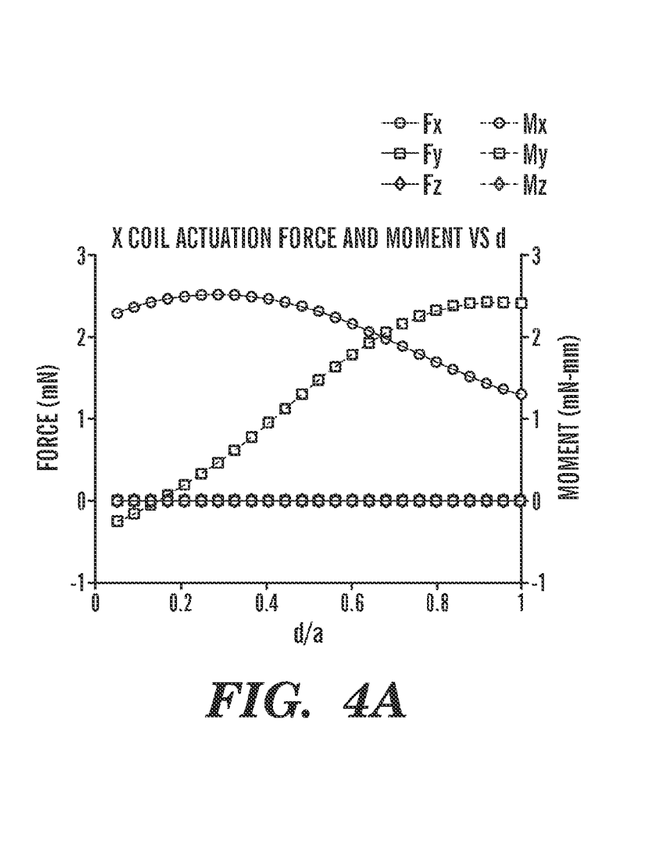
FIGS. 4A and 4B are graphical representations of actuation force and moment calculations versus geometric parameter ratio d/a for the exemplary coils of FIGS. 3A-3D.
Figure 4B:
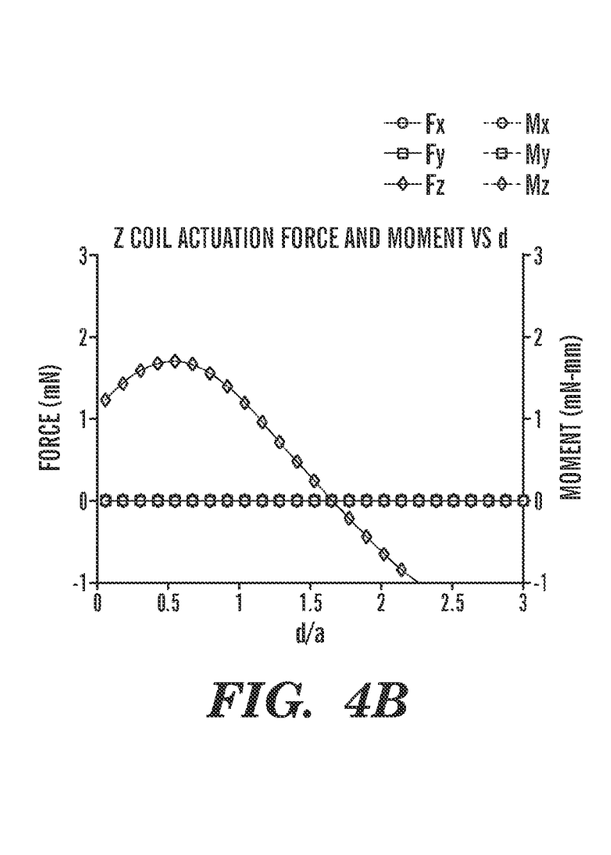

Referring to FIGS. 4A and 4B, forces and moments of exemplary x- and z-actuator coils 28, 30, are plotted versus d/a ratio for a typical geometry with magnet dimension a=1 mm. FIG. 4A indicates that the parasitic y-directed moment due to the pair of x-actuator coils 28 of FIG. 3D is eliminated when the ratio d/a~0.146. As shown, moment cancellation occurs for this geometry because the out-of-plane forces acting on the coil segments are nominally balanced. It is also noted that the x-actuator force is near maximum for the moment-compensating value of d/a.

Similarly, the z-actuator coil 30 may be configured for maximum force by properly selecting ratio d/a. As shown, FIG. 4B indicates that the maximum out-of-plane force for an example actuator occurs when d/a~0.55. The maximum z-force is obtained when the y-directed coil segments (FIG. 3C) are in regions where the x-component of the magnetic flux density is greatest, i.e., above the interface between magnets of array 15 (FIG. 3B). It should be noted that the optimum geometric ratios for maximum force and parasitic moment minimization will change with the parameter w, the winding spacing, and the coil height above the magnet arrays.

Figure 5A:
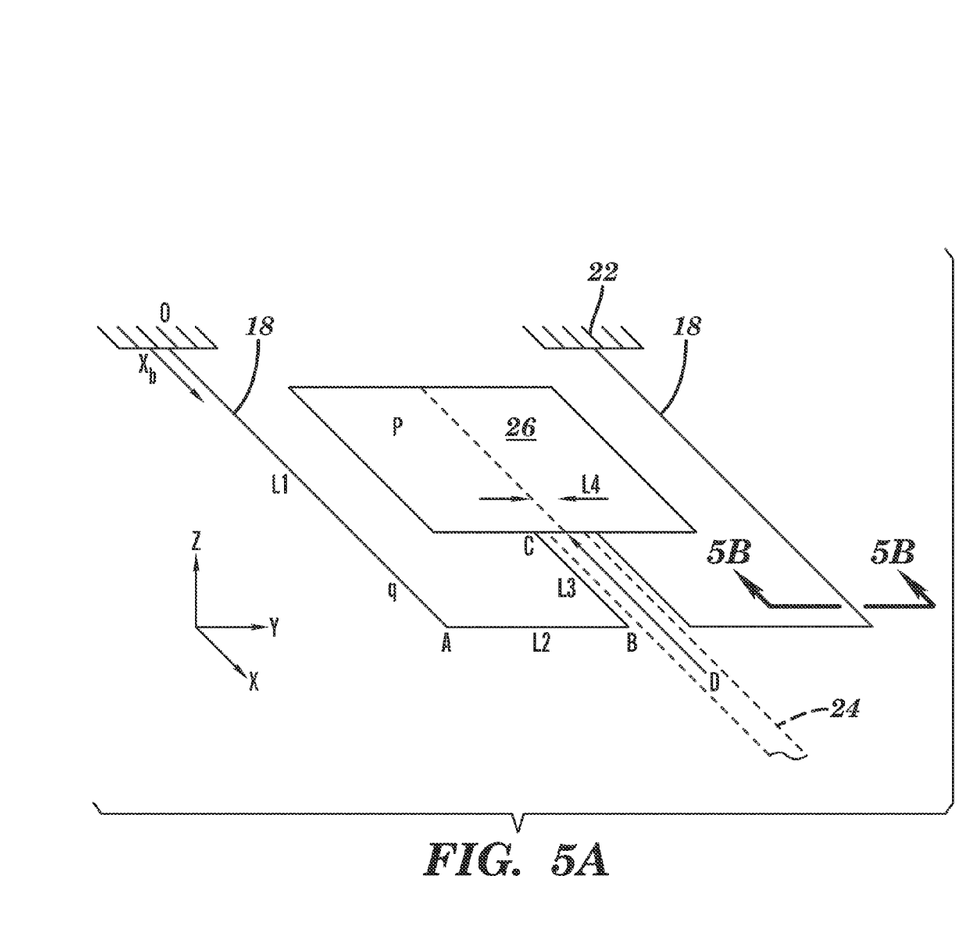
FIG. 5A is a perspective schematic representation of portions of the actuator of FIG. 3A.
Figure 5B:
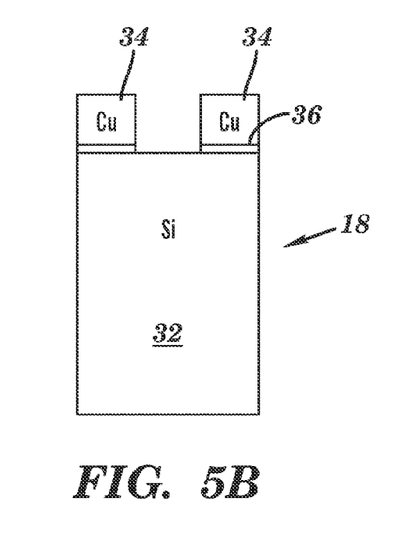
FIG. 5B is a schematic view taken along 5B-5B of FIG. 5A.

Turning now to FIGS. 5A, 5B, in various embodiments, flexures 18 may also be configured to compensate for thermal error in the out-of-plane (z) direction. This error is due to bimetallic bending of the copper-on-silicon flexures. For clarity, actuator paddle 26, flexures 18, and support (ground) 22 are shown schematically in these figures.

In use, as the coils 28, 30 (FIGS. 3B-3D) are energized to move the stage away from a neutral position, power is dissipated through resistive heating of the coil windings and lead traces. The heat is conducted away from the coils 28, 30 through the flexures 18, which as best shown in FIG. 5B, may be fabricated from a semiconductor base (e.g., silicon) 32, which supports electrical conductors (e.g., copper leads) 34 thereon, with an insulator 36 (e.g., a thin layer of silicon dioxide) therebetween. Differential thermal expansion between the copper 34 and silicon 32 induces bending of the flexure bearings which may lead to out-of-plane parasitic thermal error motion of several hundreds of nanometers at stage 16 (FIG. 1) in some embodiments.

In order to eliminate the thermal error motions, the temperature distribution along the flexure 18 from the actuator paddle 26 to ground 22 may be computed using a simplified conductive heat transfer model along the flexure, as shown in the following Equation 2:

$$T(x_b) = \frac{-q}{2k_{eq}} x_b^2 + \left( \frac{qL_{tot}}{k_{eq}} + \frac{P}{A_{eq}k_{eq}} \right) x_b + T_o. \quad \text{Eq. 2}$$

which may be used to calculate the bending curvature along the flexure 18 from the paddle 26 to the ground 22. Based on well-known equations that govern thermomechanical bending of beams due to differential thermal expansion, the relative lengths (L1, L2, L3, and L4 in FIG. 5A) of the flexures 18 may be configured so that the out-of-plane thermal error is nominally eliminated. Moreover, this thermal error correction may be effected at nominally any level of current expected to be input into the actuator coils.

It should be noted that length L4 is the distance from the centerline of beam 24 to point at which flexure 18 engages actuator paddle 26.

Figure 6:
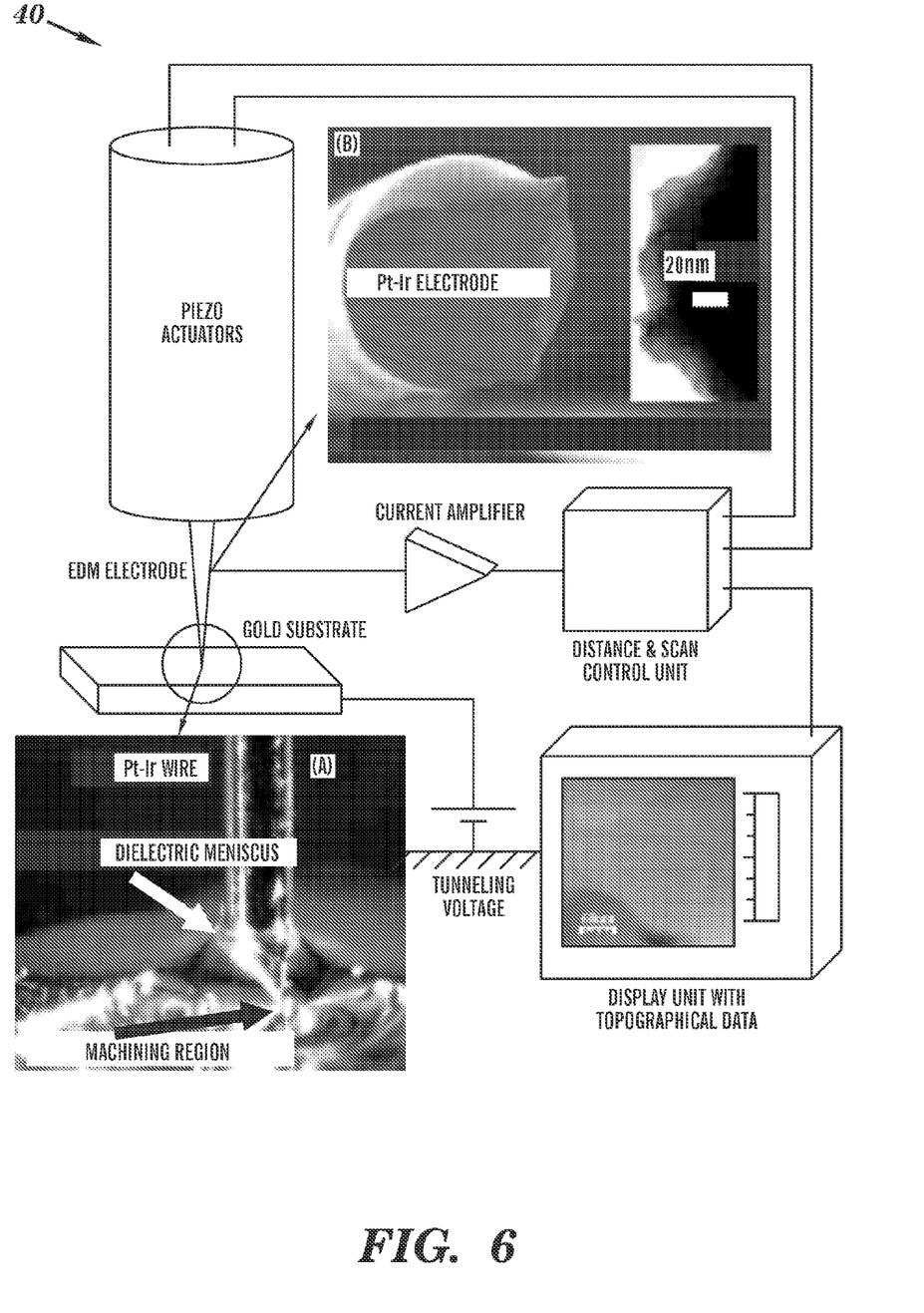
FIGS. 6-8 are schematic views of exemplary systems into which the embodiment of FIG. 2 may be incorporated.
Figure 7:
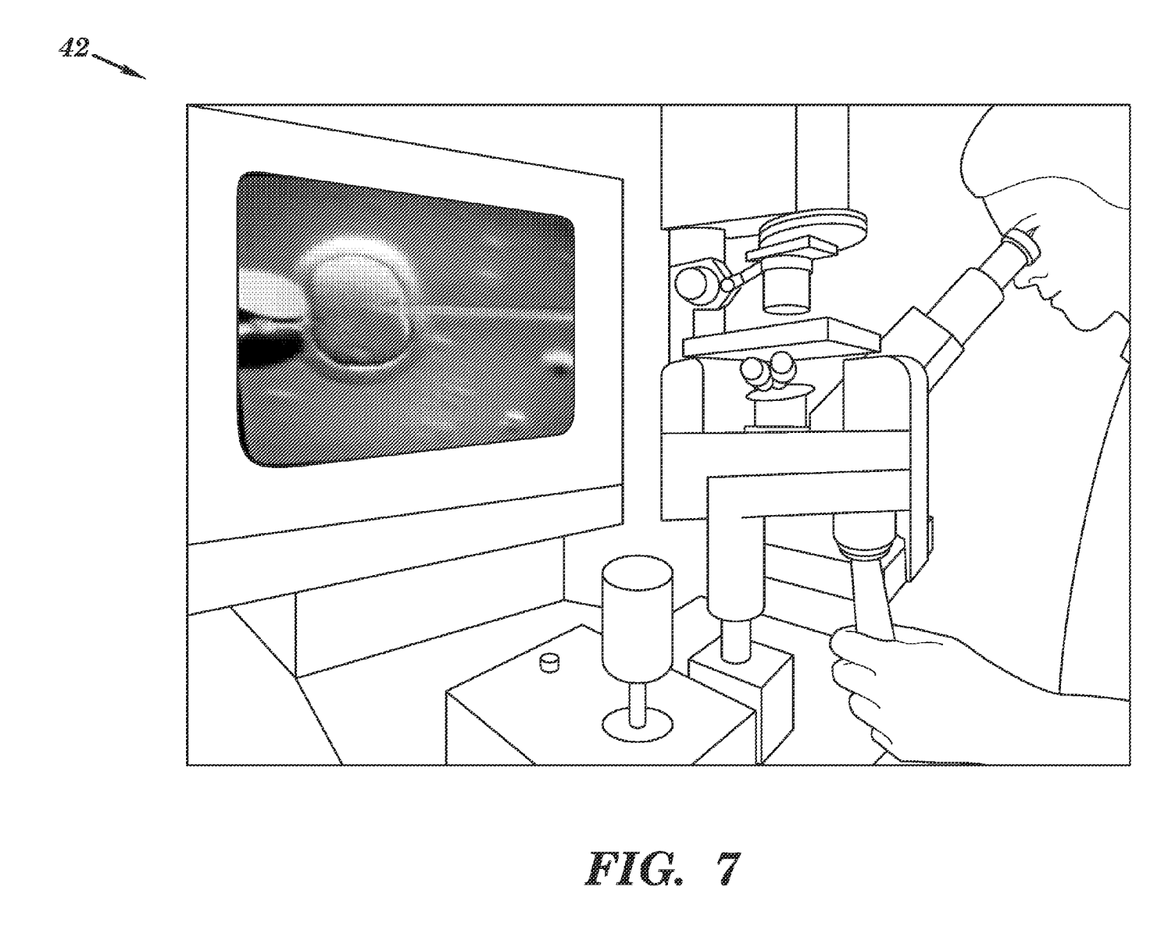
Figure 8:
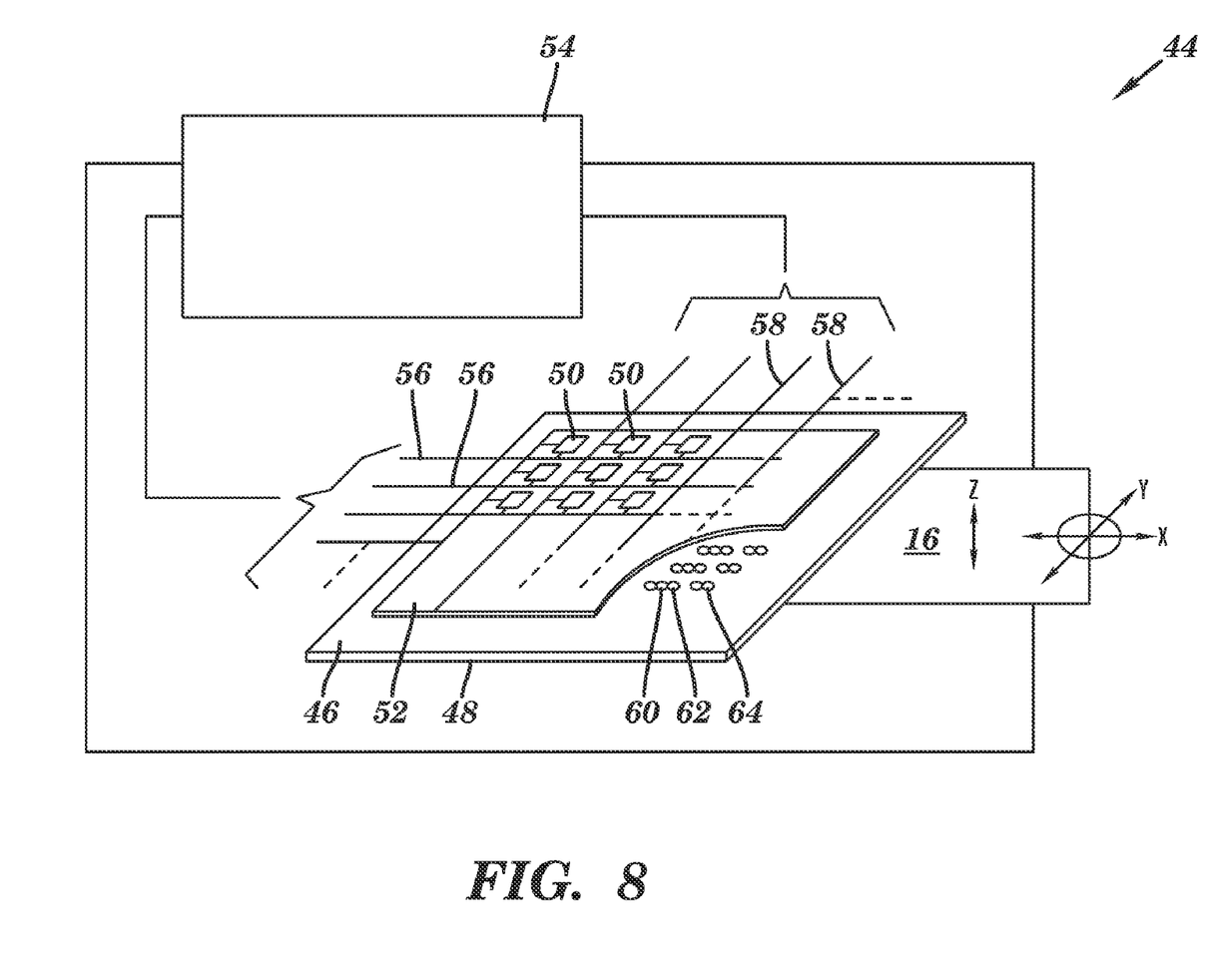

Turning now to FIGS. 6-8, embodiments of nanopositioner 10 may be used in nominally any application in which high speed positioning with controlled precision to within tens of nanometers or less is required. Such applications may include, for example, nano-electro machining systems 40 as shown schematically in FIG. 6, nano-manipulators such as the cellular micro-injection workstation 42 of FIG. 7, and data storage systems 44 such as shown in FIG. 8.

For example, a nanopositioner 10 provided with a transverse dimension D (FIG. 1) of about 20 mm, may provide a natural frequency (bandwidth) of about 1 kHz, a stroke of 10 μm, positional precision within about 10 nm, and a power requirement of about 300 mWatts or less. This nanopositioner 10 may be incorporated into data storage device 44 of FIG. 8. As shown, device 44 may include a storage medium 46 formed by a thin polymer layer supported by a substrate 48, e.g., formed of silicon. An array of probes 50 is mounted on a common frame 52. A large number of probes, such as 1024 or even more, may be used, or only just one probe. Each probe 50 comprises terminals which are electrically connected to a control and information processing unit 54 via electrically conductive lines. In order to reduce the complexity of the wirings, the terminals may be connected via row-lines 56 and column-lines 58 and possibly via multiplexers (not shown) to the control and information processing unit 54. The control and information processing unit 54 is configured for controlling the data storage system and for controlling a movement of the storage medium 46 (and substrate 48) relative to the frame 52 in x- y- and z-directions. This movement may be effected by stage 16 of nanopositioner 10, which supports storage medium 2, e.g., via substrate 4. (In FIG. 8, portions of nanopositioner other than stage 16 have been omitted for clarity.)

Indentations 60, 62, 64 are provided in storage medium 46, to represent logical information. For example, an indentation represents a logical "1", whereas the absence of the indentation mark may represent a logical "0". The indentations 60, 62, 64 are of a nanoscale diameter. They may, for example, have a diameter ranging from 10 to 50 nm. The formation of indentations 60, 62, 64 and also the detection or the erasure thereof may be accomplished by moving the probe(s) 50 into contact (either physical or non-physical) with respective indentation marks by use of nanopositioner 10 as controlled by processing unit 54.

Figure 9:
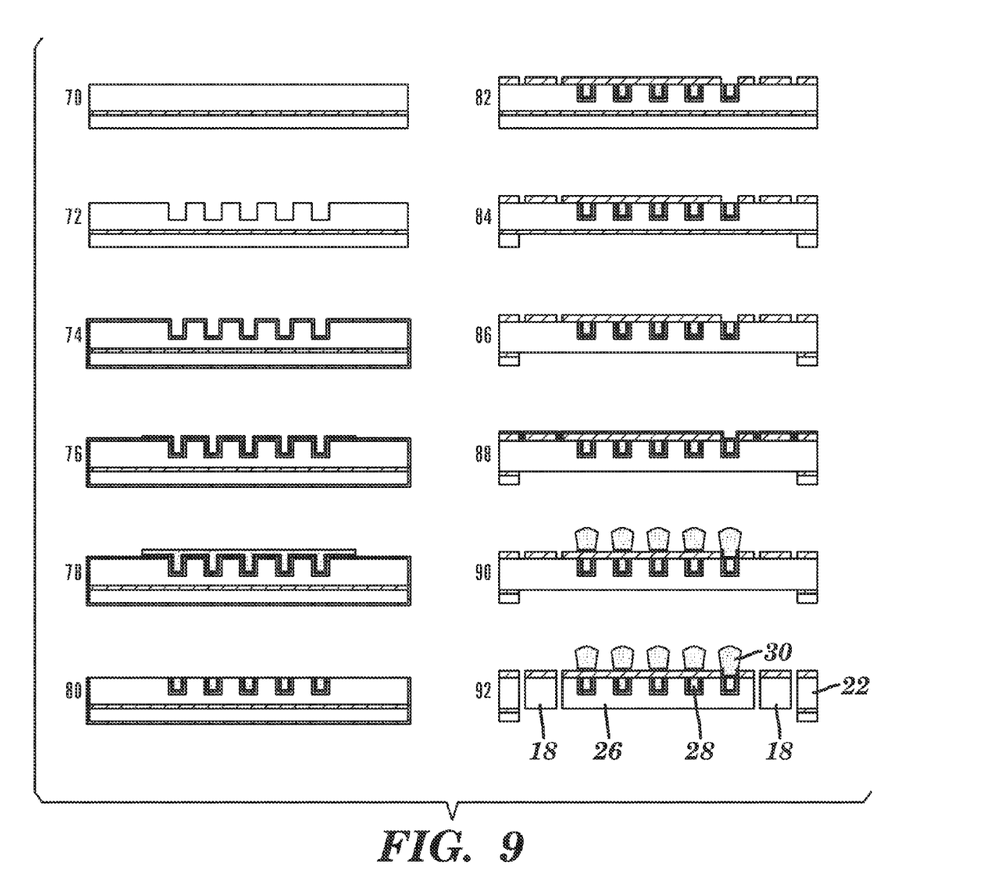
FIG. 9 is a series of schematic cross-sections taken along A-A of FIG. 1, at various steps in a representative fabrication of an embodiment of the present invention.

Embodiments of the invention having been described, a representative method of fabrication thereof is shown in FIG. 9.

At 70, fabrication commences with a conventional Silicon-on-insulator (SOI) substrate with, e.g., a 100 um device layer thickness and 1 um thick buried oxide. At 72, trenches are etched (e.g., Deep RIE etch) to be used for buried copper coils. The trenches are thermally oxidized at 74, followed by deposition 76 of a seed layer for copper electroplating. The trenches are then filled 78 with electroplated copper, followed by planarization 80 of the upper surface, e.g., by chemical-mechanical polish (CMP).

Silicon dioxide is deposited 82, e.g., using plasma-enhanced chemical-vapor-deposition (PECVD), and patterned using a wet etch. The backside of the device is etched 84 (e.g., Deep RIE etch) to define the thickness and to expose the buried oxide layer. The exposed buried oxide layer is etched 86, e.g., using a wet etch, while applying a photoresist to protect the (opposite) front side of the device. A seed layer for copper electroplating is deposited to the front side at 88, followed by electroplating 90 the upper coils 30 using removable photoresist mold, followed by etching seed layer from the remainder of the front side. The device is etched 92 (e.g., Deep RIE etch with oxide and Cu as masks) to release flexures 18 from the combination actuator paddle 26 and coils 28, 30.

In summary, as discussed hereinabove, embodiments of actuator 12 provide for collocated and independently controllable in- and out-of-plane (e.g., X- and Z-axes) electromagnetic actuator forces enabled by two independent coils 28, 30 having shifted phases relative to a magnet structure 15. Parasitic moments may be compensated and actuation forces optimized by controlling the geometry of the coils 28, 30. The coils may be fabricated as a double coil stack using as few as two metal layers separated by an insulator such as silicon dioxide.

Additional embodiments use the actuator 12 to provide a 6-Axis Electromagnetic nanopositioner 10, capable of relatively high-frequency operation, e.g., bandwidth of about 150 Hz to 1 kHz in some embodiments, and about 500 Hz to about 1 kHz in others. These embodiments also provide a range of (stage) motion within a range of about 1 to 30 microns in some embodiments, and about 5 to 15 microns in others, enabled by electromagnetic actuation. This stage may be located with nanometer precision, such as within a range of about 5 to about 100 nanometers in some embodiments, and a range of about 5 to 15 in others. These embodiments provide a tightly constrained design: e.g., nominally one-to-one input to DOF actuation, so that six input commands (e.g., two independently actuatable coil layers at each of three actuators) generate the same number of (six) output motions.

These embodiments also provide integration of microfabricated (e.g., micromachined) single-crystal semiconductor (e.g., silicon) flexures 18 and microfabricated (e.g., electroplated) coils. The coil leads 34 are integrated with the flexures 18, and the flexures are configurable to nominally eliminate out-of-plane thermal error motions.

The combination coils/paddle/compliant mechanism may be integrally fabricated using the same microfabrication processes. These processes also enable the double coil stack 13 to be produced using only two metal layers separated by an electrical insulator such as silicon dioxide. Moreover, fabrication does not require the use of permanent polymer and/or organic structures for planarization, stacking, or electrical vias, thus simplifying fabrication, saving weight, and enabling high-temperature operation. The microfabrication is thus relatively simple, while enabling relatively thick copper coils to be electroplated on bulk-micromachined single-crystal-silicon flexures.

It should be understood that any of the features described with respect to one of the embodiments described herein may be used with any other of the embodiments described herein without departing from the spirit and scope of the present invention.

Moreover, although embodiments have been shown and described having particular numbers of coils/coil sets, it should be recognized than substantially any number of coils/coil sets may be used without departing from the scope of the present invention.

In the preceding specification, the invention has been described with reference to specific exemplary embodiments thereof. It will be evident that various modifications and changes may be made thereunto without departing from the broader spirit and scope of the invention as set forth in the claims that follow. The specification and drawings are accordingly to be regarded in an illustrative rather than restrictive sense. restrictive sense.

Having thus described the invention, what is claimed is:

1. An electromagnetically actuated microfabricated nanopositioner comprising:
    (a) a microfabricated compliant mechanism including:
        a stage;
        a support;
        a plurality of flexures coupled to said stage and to said support;
        a plurality of beams each coupled to at least one of said plurality of flexures; and
        said beams sized and shaped wherein displacement thereof generates a displacement of said stage relative to said support;
        said compliant mechanism being substantially planar to define in-plane directions substantially parallel thereto; and
    (b) a plurality of actuators respectively coupled to said plurality of beams, each of said actuators including:
        at least one first coil in the form of a microfabricated, electrically conductive first layer substantially parallel to said compliant mechanism;
        at least one second coil in the form of a microfabricated electrically conductive second layer superposed with said first coil to form a coil stack; and
        a magnet array disposed in magnetic communication with said coil stack;
        said first and second coils being selectively, electrically actuatable to generate relative movement
        between said coil stack and said magnet array both in-plane and out-of-plane;
    (c) wherein said stage is configured for controlled movement with 6 degrees of freedom.

2. The nanopositioner of claim 1, wherein said compliant mechanism and said first and second coils are micro-lithographic.

3. A MEMS nanopositioner comprising:
    (a) a plurality of MEMS actuators including:
        at least one first coil in the form of a microfabricated, electrically conductive first layer;
        at least one second coil in the form of a microfabricated electrically conductive second layer, said second coil being superposed with said first coil to form a coil stack;
        said layers being substantially planar to define in-plane directions parallel thereto; and
        a magnet array superposed, in magnetic communication, with said coil stack;
        said first and second coils being selectively, electrically actuatable to generate relative movement between said coil stack and said magnet array both in-plane and out-of-plane;
    (b) a microfabricated compliant mechanism including
        a stage;
        a support;
        a plurality of flexures coupled to said stage and to said support;
        a plurality of beams each coupled to at least one of said plurality of flexures;
        said beams sized and shaped wherein displacement thereof generates a displacement of said stage relative to said support;
        said compliant mechanism being substantially planar extending in-plane with said coils; and
        said plurality of actuators respectively coupled to said plurality of beams; and
    (c) wherein said stage is configured for controlled movement with 6 degrees of freedom.

4. The actuator of claim 3, wherein said magnet array is immovably coupled to a ground, to form a moving-coil actuator.

5. The actuator of claim 3, wherein the coils are sized and shaped to compensate for any parasitic moments.

6. The actuator of claim 3, comprising only two microfabricated metal layers.

7. The nanopositioner of claim 3, wherein said compliant mechanism and said coil stacks of said actuators are micro-lithographic.

8. The nanopositioner of claim 7, wherein said coil stacks of said plurality of actuators are respectively coupled to said plurality of beams, to form moving-coil actuators.

9. The nanopositioner of claim 3, configured for actuation at a frequency within a range of:
    at least about 150 Hz; and up to about 1 kHz.

10. The nanopositioner of claim 9, configured for actuation at a frequency within a range of:
from about 500 Hz;
to about 1 kHz.

11. The nanopositioner of claim 3, wherein said stage is configured for motion within a range of:
about 1 micron;
to about 30 microns.

12. The nanopositioner of claim 11, wherein said stage is configured for motion within a range of:
about 5 microns;
to about 15 microns.

13. The nanopositioner of claim 11, wherein said stage is configured for being precisely located with a range of precision within a range of:
about 5 nm;
to about 100 nm.

14. The nanopositioner of claim 13, wherein said stage is configured for being precisely located with a range of precision within a range of:
about 5 nm;
to about 15 nm.

15. The nanopositioner of claim 3, having a one-to-one correspondence of inputs to said degrees of freedom.

16. The nanopositioner of claim 3, wherein said compliant mechanism is microfabricated integrally with said coils.

17. The nanopositioner of claim 16, wherein said compliant mechanism comprises a single-crystal semiconductor.

18. The nanopositioner of claim 17, leads for said coils are integrally disposed on said flexures.

19. The nanopositioner of claim 3, wherein said flexures are configured to substantially eliminate out-of-plane thermal error motions.

20. The nanopositioner of claim 3, being free from the use of polymeric and organic materials.

21. The nanopositioner of claim 3, disposed within a nano-electro machining system.

22. The nanopositioner of claim 3, disposed within a nano-manipulator.

23. The nanopositioner of claim 22, wherein said nano-manipulator comprises a cellular micro-injection workstation.

24. The nanopositioner of claim 3, disposed within a data storage system.

25. The actuator of claim 3, comprising a dielectric layer disposed between said first layer and said second layer.

26. A method of effecting a MEMS actuation, said method comprising:
(a) providing at least one actuator having:
at least one first coil in the form of a microfabricated, electrically conductive first layer;
at least one second coil in the form of a microfabricated electrically conductive second layer, said second coil being superposed with said first coil to form a coil stack;
said layers being substantially planar to define in-plane directions parallel thereto; and
a magnet array superposed, in magnetic communication, with said coil stack;
(b) selectively, electrically actuating the first and second coils to generate relative movement between the coil stack and the magnet array both in-plane and out-of-plane;
(c) providing a microfabricated compliant mechanism including:
a stage;
a support;
a plurality of flexures coupled to said stage and to said support;
a plurality of beams each coupled to at least one of said plurality of flexures;
said beams sized and shaped wherein displacement thereof generates a displacement of said stage relative to said support;
said compliant mechanism being substantially planar, extending in-plane; and
a plurality of said actuators respectively coupled to said plurality of beams; and
(d) selectively, electrically actuating the first and second coils of each of said actuators to generate controlled movement of said stage with 6 degrees of freedom.

* * * * *